US009823874B2

(12) United States Patent
Sadd et al.

(10) Patent No.: US 9,823,874 B2
(45) Date of Patent: *Nov. 21, 2017

(54) MEMORY DEVICE WITH COMBINED NON-VOLATILE MEMORY (NVM) AND VOLATILE MEMORY

(71) Applicant: FREESCALE SEMICONDUCTOR, INC., Austin, TX (US)

(72) Inventors: Michael A. Sadd, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 384 days.

This patent is subject to a terminal disclaimer.

(21) Appl. No.: 14/626,177

(22) Filed: Feb. 19, 2015

(65) Prior Publication Data
US 2016/0246539 A1 Aug. 25, 2016

(51) Int. Cl.
G11C 8/00 (2006.01)
G06F 3/06 (2006.01)
G11C 14/00 (2006.01)
G11C 11/00 (2006.01)
G11C 7/12 (2006.01)

(52) U.S. Cl.
CPC .......... *G06F 3/0647* (2013.01); *G06F 3/0604* (2013.01); *G06F 3/068* (2013.01); *G11C 11/005* (2013.01); *G11C 14/009* (2013.01); *G11C 7/12* (2013.01)

(58) Field of Classification Search
None
See application file for complete search history.

(56) References Cited

U.S. PATENT DOCUMENTS

| 6,222,765 | B1 | 4/2001 | Nojima |
| 6,324,116 | B1 | 11/2001 | Noh et al. |
| 6,828,823 | B1 | 12/2004 | Tsui et al. |
| 7,081,771 | B2 | 7/2006 | Agrawal et al. |
| 7,099,189 | B1 | 8/2006 | Plants |
| 7,539,054 | B2 | 5/2009 | Ashokkumar et al. |
| 7,760,540 | B2 | 7/2010 | Still |
| 8,531,880 | B2 | 9/2013 | Rao |
| 2006/0193174 | A1 | 8/2006 | Choi et al. |
| 2007/0189062 | A1 | 8/2007 | Plants |

(Continued)

OTHER PUBLICATIONS

Office Action Restriction/Election—U.S. Appl. No. 14/331,274, dated Jan. 21, 2016, 4 pages.

(Continued)

*Primary Examiner* — Son Dinh
*Assistant Examiner* — Sultana Begum

(57) ABSTRACT

The present disclosure provides embodiments for methods and memory devices. One embodiment of a memory device includes a first volatile memory cell having a first volatile access transistor with a current electrode coupled with a first volatile bit line; a first non-volatile memory cell having a first non-volatile access transistor with a current electrode coupled with a first non-volatile bit line; and a transfer circuit coupled between the first volatile bit line and the first non-volatile bit line. The transfer circuit is configured to: couple data latched from the first volatile bit line with the first non-volatile bit line during a store operation, and couple the first volatile bit line with the first non-volatile bit line during a restore operation.

17 Claims, 7 Drawing Sheets

(56) References Cited

U.S. PATENT DOCUMENTS

| | | |
|---|---|---|
| 2007/0211551 A1 | 9/2007 | Yogev et al. |
| 2008/0158981 A1 | 7/2008 | Johal et al. |
| 2008/0192560 A1* | 8/2008 | Lee .................... G11C 7/12 365/230.03 |
| 2011/0044109 A1* | 2/2011 | Shih ................ G11C 14/0063 365/185.08 |
| 2013/0215669 A1* | 8/2013 | Haukness .......... G11C 13/0007 365/148 |
| 2014/0078810 A1 | 3/2014 | Prenat et al. |
| 2014/0085978 A1 | 3/2014 | Lee |

OTHER PUBLICATIONS

Office Action Non-Final—U.S. Appl. No. 14/331,274, dated Jul. 5, 2016, 19 pages.

Office Action Final Rejection—U.S. Appl. No. 14/331,274, dated Nov. 30, 2016, 15 pages.

Choi et al, "Single-chip Integration of SRAM and Non-volatile Memory using Bit-line Sharing", Proceedings of the 32nd European Solid-State Circuits Conference, Sep. 19-21, 2006, pp. 295-298, IEEE, Montreaux.

Abe et al, "Novel hybrid DRAM/MRAM design for reducing power of high performance mobile CPU", IEEE International Electron Devices Meeting (IEDM), Dec. 10-13, 2012, pp. 10.5.1-10.5.4, San Francisco, CA.

Yamamoto, "Nonvolatile SRAM (NV-SRAM) using functional MOSFET merged with resistive switching devices", Custom Integrated Circuits Conference, Sep. 13-16, 2009, pp. 531-534, IEEE, San Jose, CA.

Wang et al, "Nonvolatile SRAM Cell", International Electron Devices Meeting, Dec. 11-13, 2006, pp. 1-4, IEEE, San Francisco, CA.

Tanaka et al, "Normally-off type nonvolatile static random access memory with perpendicular spin torque transfer-magnetic random access memory cells and smallest number of transistors", Japanese Journal of Applied Physics, 2014, pp. 1-4, vol. 53, No. 4S.

Notice of Allowance—U.S. Appl. No. 14/331,274, dated Apr. 25, 2017, 7 pages.

* cited by examiner

US 9,823,874 B2

MEMORY DEVICE WITH COMBINED NON-VOLATILE MEMORY (NVM) AND VOLATILE MEMORY

BACKGROUND

Field

This disclosure relates generally to memory devices and, more particularly to memory devices that combine volatile memory and NVM.

Related Art

One aspect of NVM is that it has slower write speeds than volatile memories, especially static random access memories. Also, NVMs typically have lifetimes limited by the number of program/erase cycles that they undergo. One approach to addressing these issues is to have the normal operations carried out using the SRAM and then, when powering down, storing the data that is to be retained in the NVM. When operations are to continue and power is present, the data stored in NVM is restored to the SRAM. Thus, normal operations are achieved with the SRAM with the attendant benefits thereof and the non-volatile function is present when power is removed. Efficient combining of the NVM and the SRAM is difficult due to the very different operating characteristics. Combining the NVM and SRAM into a single memory array is thus difficult. One example is that optimizing the program and erase functions may be in conflict with the SRAM operation. This is further complicated by the voltages that are required for program and erase are not needed for SRAM operation so that the transistors of the SRAM are preferably not made with the complicating high voltage considerations in mind.

Accordingly there is a need to provide further improvement in achieving combined volatile and non-volatile memories.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a storage node of a volatile memory is coupled to a bit line of the non-volatile memory (NVM) with a transfer circuit for restoring data in the volatile memory. The storage node of the volatile memory is used to provide either a modified signal to the bit line of the NVM for storing or is coupled to a complementary bit line of the NVM. This is better understood by reference to the drawings and the following written description.

Figure 1:
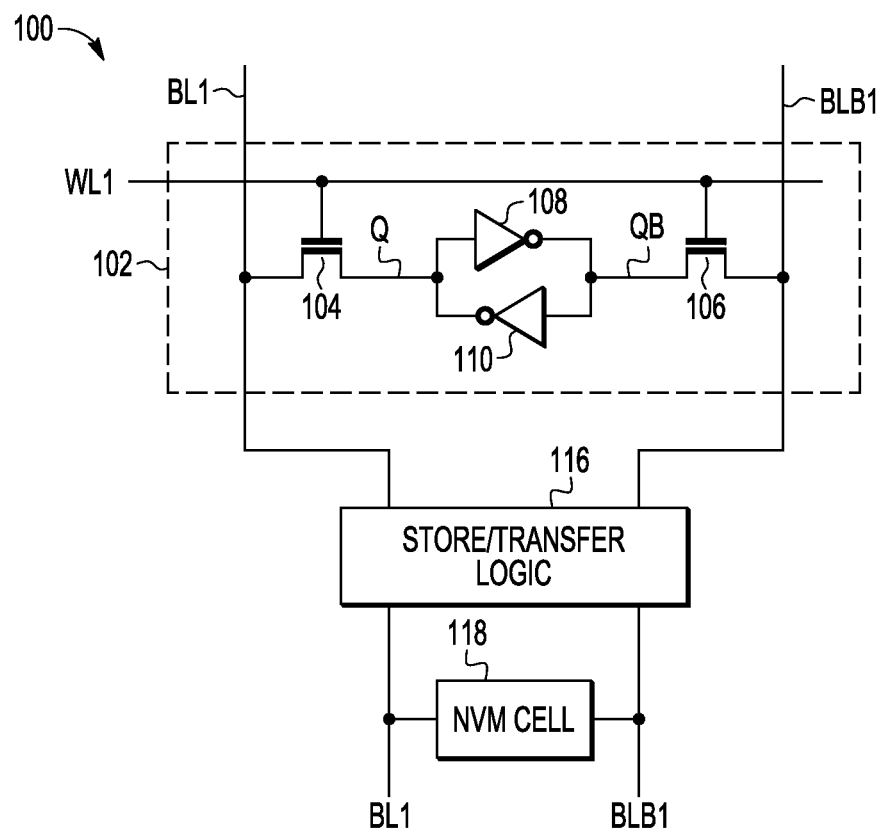
FIG. 1 is a circuit diagram showing an embodiment of a memory device having a combined volatile memory and a non-volatile memory (NVM) coupled together by store/transfer logic.

Shown in FIG. 1 is a memory device 100 having a volatile memory element 102, an NVM array 118, and store/transfer logic 116 that directly couples the true and complementary bit lines (BL and BLB) to volatile memory element 102 and to NVM cell 118. Volatile memory element 102 may be a conventional 6T SRAM cell, a dual port SRAM cell, or other suitable variant of an SRAM cell.

NVM cell 118 is part of an array of non-volatile memory cells that each include two or more programmable resistive elements to store data. In some embodiments, store/transfer logic 116 is configured so that the true bit lines are coupled to one terminal of a corresponding resistive element and the complementary bit lines are coupled to one terminal of another corresponding resistive element in each of the memory cells, as further described herein. A latch or flip-flop circuit can be included in store/transfer logic 116 to store data that is being transferred from volatile memory 102 to NVM array 118. The temporary storage allows the volatile memory 102 to continue operation while the data is transferred from the flip-flop in store/transfer logic 116 to NVM array 118. Instead of using interface logic between each volatile memory cell and each non-volatile memory cell, store/transfer logic 116 can be used to amortize interface circuit elements between columns of volatile and non-volatile memory cells that are coupled to one another by true and complementary bit lines, as further described herein.

Figure 2:
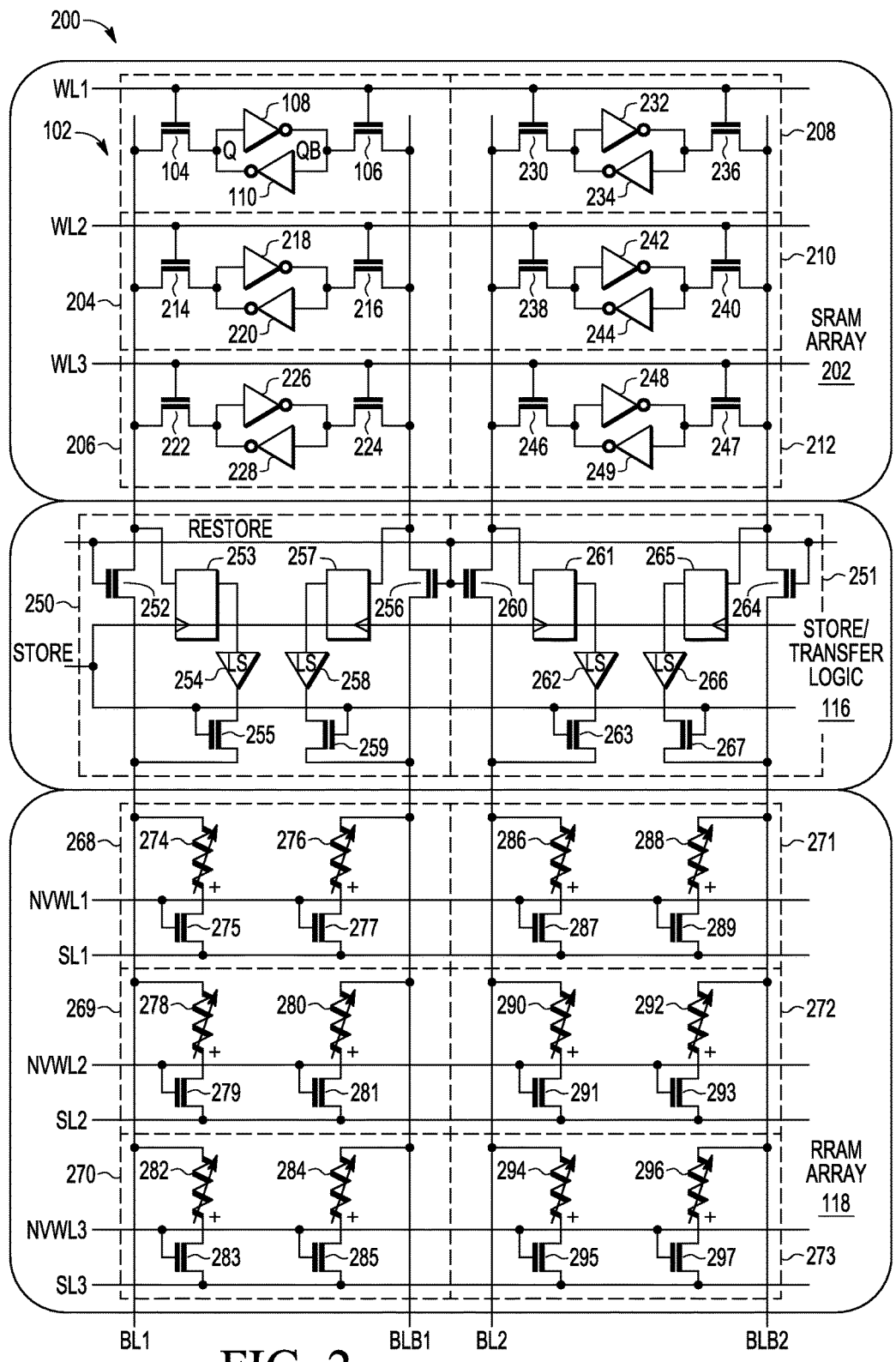
FIG. 2 is a circuit diagram of an embodiment of the memory device of FIG. 1.

FIG. 2 is a circuit diagram of an embodiment of a memory device 200 that can be used to implement the memory device 100 of FIG. 1. Memory device 200 includes volatile memory array 202, store/transfer logic 116, and NVM array 118. Volatile memory array 202 has a first row that includes memory cells 102 and 208, a second row that includes memory cells 204 and 210, and a third row that includes memory cells 206 and 212. A first column of volatile memory array 202 includes memory cells 102, 204, 206, and a second column includes memory cells 208, 210, 212. Additional rows and columns of memory cells are typically included in memory array 202, with a limited number of cells being shown for purposes of explanation.

In this example, memory cells 102, 204-212 are static random access memory (SRAM) cells connected in conventional fashion to bit lines BL1, BLB1, BL2, and BLB2, and word lines WL1 WL2, WL3. Memory cell 102 includes pass gates 104, 106 and inverters 108, 110. Memory cell 204 includes pass gates 214, 216 and inverters 218, 220. Memory cell 206 includes pass gates 222, 224 and inverters 226, 228. Memory cell 208 includes pass gates 230, 236 and inverters 232, 234. Memory cell 210 includes pass gates 238, 240 and inverters 242, 244. Memory cell 212 includes pass gates 246, 247 and inverters 248, 249.

Pass gates 104, 214, 222 have a first current electrode coupled to bit line BL1, a control electrode coupled to respective word lines WL1, WL2 WL3, and a second current electrode coupled to an input of respective inverters 108, 218, 226, and an output of respective inverters 110, 220, 228. Pass gates 106, 216, 224 have a first current electrode coupled to complementary bit line BL1B, a control electrode coupled to respective word lines WL1, WL2 WL3, and a second current electrode coupled to an input of respective inverters 110, 220, 228, and an output of respective inverters 108, 218, 226. The input/output connections of inverters 108 and 110 are the storage nodes of memory cell 102. In this example, memory cell 102 is a static random access (SRAM) cell connected in conventional fashion to bit lines BL1 and BLB1 and word line WL1.

Pass gates 230, 238, 246 have a first current electrode coupled to bit line BL2, a control electrode coupled to respective word lines WL1, WL2 WL3, and a second current electrode coupled to an input of respective inverters 232, 242, 248, and an output of respective inverters 234, 244, 249. Pass gates 236, 240, 247 have a first current electrode coupled to complementary bit line BL2B, a control electrode coupled to respective word lines WL1, WL2 WL3, and a second current electrode coupled to an input of respective inverters 234, 244, 249, and an output of respective inverters 232, 242, 248.

The input/output connections of inverters 108/110, 218/220, 226/228, 232/234, 242/244, and 248/249 are the respective storage nodes (Q and QB) of memory cells 102 and 204-212.

Store/transfer logic 116 is coupled between volatile memory array 202 and NVM array 118 and includes a first store/transfer circuit 250 coupled between first true bit line BL1 and first complementary bit line BLB1, and a second store/transfer circuit 251 coupled between second true bit line BL2 and second complementary bit line BLB2. Store/transfer circuits 250, 251 receive a restore signal RESTORE and a store signal STORE. Restore occurs, as indicated by restore signal RESTORE being active, when volatile memory array 202 is loaded with data that has been kept in NVM array 118, for example, in response to power being restored. Store occurs, as indicated by signal STORE being active, when NVM array 118 is loaded with the most recent data present in volatile memory array 202, for example, in preparation for a loss of power.

Store/transfer circuit 250 includes restore transistors 252, 256, latches or flip-flops 253, 257, level shifters 254, 258, and store transistors 255, 259. A control electrode of restore transistors 252, 256 is coupled to the restore signal RESTORE. A first current electrode of restore transistor 252 is coupled to first bit line BL1 that is coupled to a first column of memory cells 102, 204, 206 in volatile array 202 and a second current electrode of restore transistor 252 is coupled to first bit line BL1 that is coupled to a first column of memory cells 268, 269, 270 in NVM array 118.

Latch 253 includes a first input coupled to first true bit line BL1 at the first current electrode of restore transistor 252, an active low enable input coupled to the store signal STORE, and an output coupled to an input of level shifter 254. Transistor 255 includes a first current electrode coupled to an output of level shifter 254, a control electrode coupled to the store signal STORE, and a second current electrode coupled to first true bit line BL1 and the second current electrode of restore transistor 252.

Latch 257 includes a first input coupled to first complementary bit line BLB1 at the first current electrode of restore transistor 259, an active low enable input coupled to the store signal STORE, and an output coupled to an input of level shifter 258. Transistor 259 includes a first current electrode coupled to an output of level shifter 258, a control electrode coupled to the store signal STORE, and a second current electrode coupled to first complementary bit line BLB1 and the second current electrode of restore transistor 256.

Store/transfer circuit 251 includes restore transistors 260, 264, latches or flip-flops 261, 265, level shifters 262, 266, and store transistors 263, 267. A control electrode of restore transistors 260, 264 is coupled to the restore signal RESTORE. A first current electrode of restore transistor 260 is coupled to second bit line BL2 that is coupled to a second column of memory cells 208, 210, 212 in volatile array 202 and a second current electrode of restore transistor 260 is coupled to second true bit line BL2 that is coupled to the second column of memory cells 271, 272, 273 in NVM array 118.

Latch 261 includes a first input coupled to second true bit line BL2 at the first current electrode of restore transistor 260, an active low enable input coupled to the store signal STORE, and an output coupled to an input of level shifter 262. Transistor 263 includes a first current electrode coupled to an output of level shifter 262, a control electrode coupled to the store signal STORE, and a second current electrode coupled to second true bit line BL2 at the second current electrode of restore transistor 260.

Latch 265 includes a first input coupled to second complementary bit line BLB2 at the first current electrode of restore transistor 267, an active low enable input coupled to the store signal STORE, and an output coupled to an input of level shifter 266. Transistor 267 includes a first current electrode coupled to an output of level shifter 266, a control electrode coupled to the store signal STORE, and a second current electrode coupled to second complementary bit line BLB2 and the second current electrode of restore transistor 264.

Regarding NVM array 118, memory cell 268 includes programmable resistive elements 274, 276 and transistors 275, 277. Resistive element 274 has a first terminal coupled to first true bit line BL1 and a second terminal coupled to a first current electrode of transistor 275. A control electrode of transistor 275 is coupled to a first non-volatile memory word line NVWL1, and a second current electrode of transistor 275 is coupled to a first source line SL1. Resistive element 276 has a first terminal coupled to first complementary bit line BLB1 and a second terminal coupled to a first current electrode of transistor 277. A control electrode of transistor 277 is coupled to first non-volatile memory word line NVWL1, and a second current electrode of transistor 277 is coupled to a first source line SL1.

Memory cell 269 includes resistive elements 278, 280 and transistors 279, 281. Resistive element 278 has a first terminal coupled to first true bit line BL1 and a second terminal coupled to a first current electrode of transistor 279. A control electrode of transistor 279 is coupled to a second non-volatile memory word line NVWL2, and a second current electrode of transistor 279 is coupled to a second source line SL2. Resistive element 280 has a first terminal coupled to first complementary bit line BLB1 and a second terminal coupled to a first current electrode of transistor 281. A control electrode of transistor 281 is coupled to second non-volatile memory word line NVWL2, and a second current electrode of transistor 281 is coupled to a second source line SL2.

Memory cell 270 includes resistive elements 282, 284 and transistors 283, 285. Resistive element 282 has a first terminal coupled to first true bit line BL1 and a second terminal coupled to a first current electrode of transistor 283. A control electrode of transistor 283 is coupled to a third non-volatile memory word line NVWL3, and a second current electrode of transistor 283 is coupled to a third source line SL3. Resistive element 284 has a first terminal coupled to first complementary bit line BLB1 and a second terminal coupled to a first current electrode of transistor 285. A control electrode of transistor 285 is coupled to third non-volatile memory word line NVWL3, and a second current electrode of transistor 285 is coupled to a third source line SL3.

Memory cell 271 includes resistive elements 286, 288 and transistors 287, 289. Resistive element 286 has a first terminal coupled to second true bit line BL2 and a second terminal coupled to a first current electrode of transistor 287. A control electrode of transistor 287 is coupled to a first non-volatile memory word line NVWL1, and a second current electrode of transistor 287 is coupled to a first source line SL1. Resistive element 288 has a first terminal coupled to second complementary bit line BLB2 and a second terminal coupled to a first current electrode of transistor 289. A control electrode of transistor 289 is coupled to first non-volatile memory word line NVWL1, and a second current electrode of transistor 289 is coupled to a first source line SL1.

Memory cell 272 includes resistive elements 290, 292 and transistors 291, 293. Resistive element 290 has a first terminal coupled to second true bit line BL2 and a second terminal coupled to a first current electrode of transistor 291. A control electrode of transistor 291 is coupled to second non-volatile memory word line NVWL2, and a second current electrode of transistor 291 is coupled to a second source line SL2. Resistive element 292 has a first terminal coupled to second complementary bit line BLB2 and a second terminal coupled to a first current electrode of transistor 293. A control electrode of transistor 293 is coupled to second non-volatile memory word line NVWL2, and a second current electrode of transistor 293 is coupled to a second source line SL2.

Memory cell 273 includes resistive elements 294, 296 and transistors 295, 297. Resistive element 294 has a first terminal coupled to second true bit line BL2 and a second terminal coupled to a first current electrode of transistor 295. A control electrode of transistor 295 is coupled to third non-volatile memory word line NVWL3, and a second current electrode of transistor 295 is coupled to a third source line SL3. Resistive element 296 has a first terminal coupled to second complementary bit line BLB2 and a second terminal coupled to a first current electrode of transistor 297. A control electrode of transistor 297 is coupled to third non-volatile memory word line NVWL3, and a second current electrode of transistor 297 is coupled to a third source line SL3.

In the embodiment shown transistors 104, 106, 214, 216, 222, 224, 230, 236, 238, 240, 246, 247, 252, 256, 255, 259, 260, 263, 264, 267, 275, 277, 279, 281, 283, 285, 287, 289, 291, 293, 295 and 297 are N-channel transistors. In other embodiments, P-channel transistors or other suitable device(s) can be used instead of N-channel transistors, with accompanying changes as required to achieve consistent logic in the rest of the circuitry of device 200.

In operation, data is written into and read from volatile memory array 202 at relatively high speed during normal operation when power is present. In preparation for power being removed, the data from volatile memory array 202 is written into NVM array 118. This operation may be called storing or programming. When power is no longer present, the data is lost from volatile memory array 202 and maintained in NVM array 118. When power returns, the data present in NVM array 118 is loaded into volatile memory array 202. This operation may be called restoring. Thus, for example, the operation may be taken as power has been restored and data that is stored in NVM array 118 is to be written into volatile memory array 202 so that restoring is set to begin.

Figure 3:
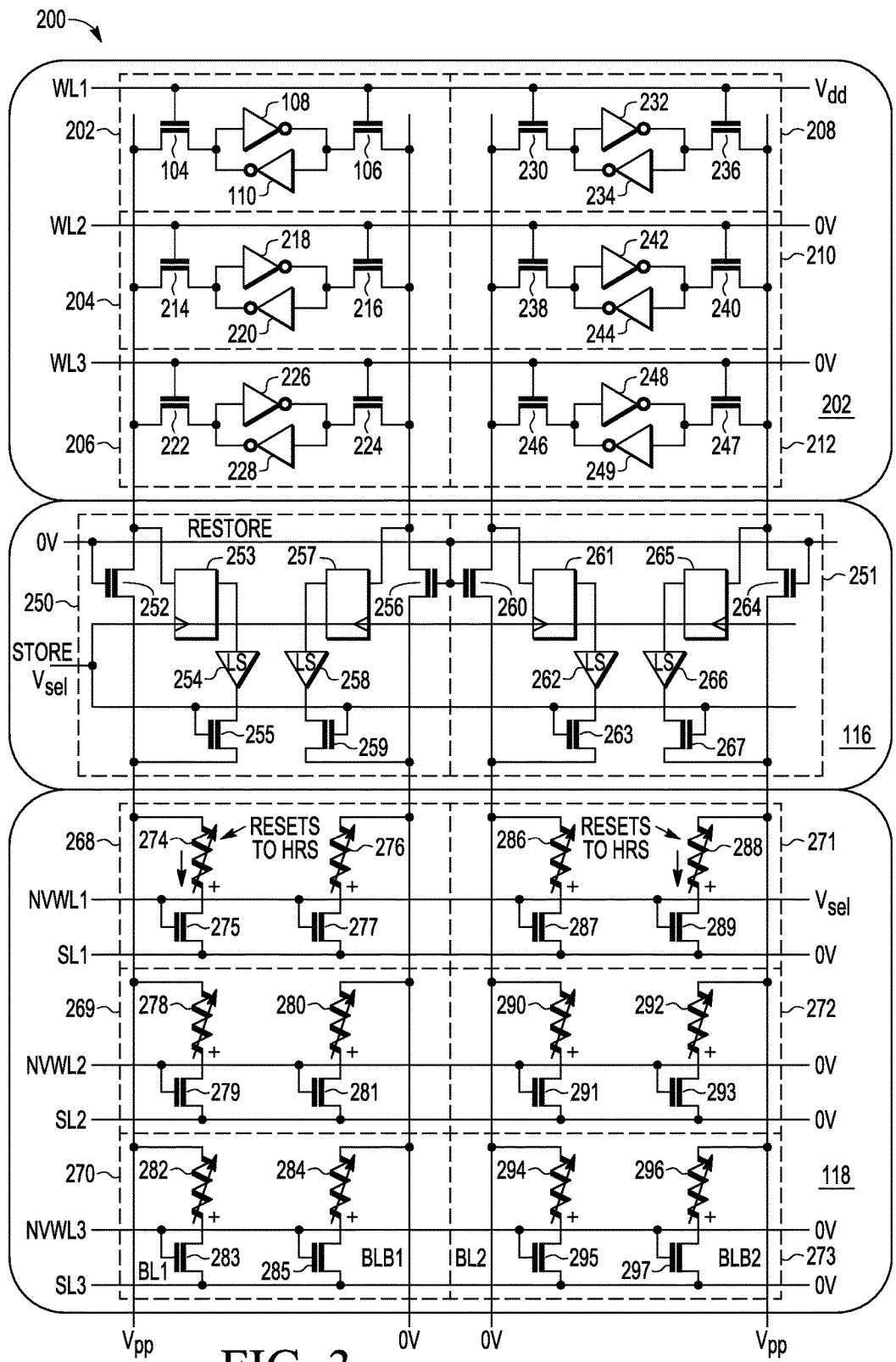
FIG. 3 illustrates voltage settings during a first phase of a program operation for the memory device of FIG. 2.

As an example of a programming operation, the data is programmed differentially into pairs of bit cells. Data from one row of volatile memory 202 is written into a corresponding row of bit cells in NVM array 118 at a time. If the power or current consumption is too large to program an entire row, additional logic may be added to program a segment of the row, and the following description may apply to this segment. FIG. 3 illustrates voltage settings to place resistive elements 274, 288 in respective NVM cells 268, 271 to a high resistance state during a first phase of a program operation in memory device 200 of FIG. 2. In particular, voltage on word line WL1 in volatile memory array 202 is set to a nominal supply voltage (VDD) while voltage on remaining word lines WL2, WL3 is set to zero. Voltage for the store signal STORE is set to a select voltage (VSEL) to enable latches 253, 257, 261 and 265, and to place transistors 255, 259, 263 and 267 in store/transfer logic 116 in conductive mode. The first non-volatile word line NVWL1 is set a select voltage (VSEL) and the first source line SL1 is set to zero voltage to allow high bias voltage at bit lines BL1 and BLB2 to program resistive elements 274, 288 to high resistance state. Level shifter 254 provides Vpp on the first true bit line BL1 in response to the state of Q in volatile cell 102 being a logic high. Level shifter 258 inhibits programming of resistive element 276 by providing 0V on BL1B. Likewise if the state of cell 208 is a logic low, level shifter 266 provides Vpp on the second complementary bit line BLB2.

In some cases, level shifting circuits 254, 258, 262, 266 include a current or voltage limiting circuit that can be used in store/transfer logic 116 to limit the current or voltage while programming resistive elements 275, 289.

Figure 4:
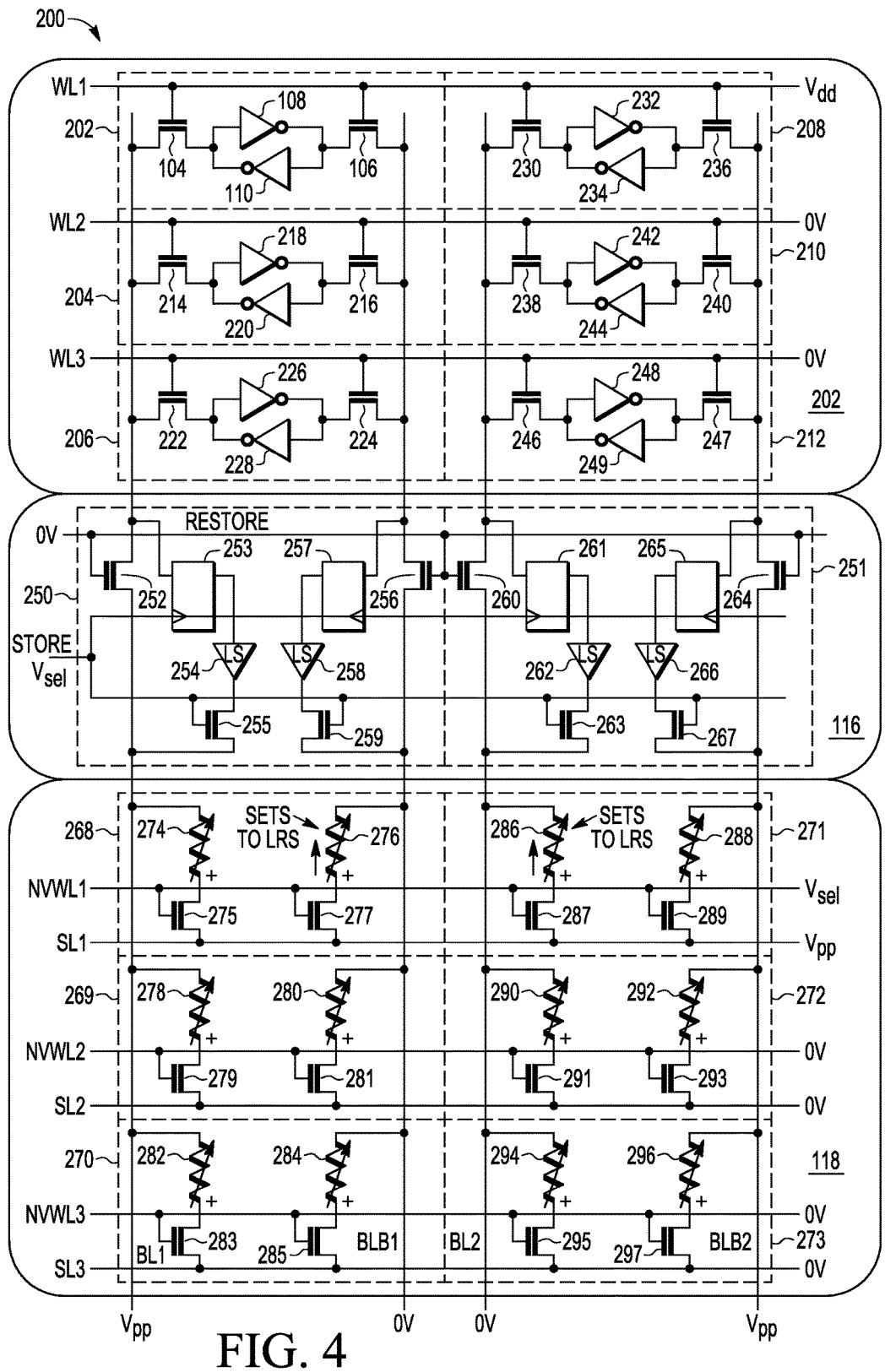
FIG. 4 illustrates voltage settings during a second phase of a program operation for the memory device of FIG. 3.

FIG. 4 illustrates voltage settings to place resistive elements 276, 286 in respective NVM cells 268, 271 to a low resistance state a second phase of a program operation for the first row of memory cells 268, 271 in the non-volatile memory portion of the memory device of FIG. 3. In particular, voltage on word line WL1 in volatile memory array 202 remains at nominal supply voltage (VDD) while voltage on word lines WL2, WL3 remains at zero. Voltage for the store signal STORE remains at select voltage (VSEL) to enable latches 253, 257, 261 and 265, and to place transistors 255, 259, 263 and 267 in store/transfer logic 116 in conductive mode. Level shifter 254 continues to provide Vpp on the first true bit line BL1 that inhibits the programming of resistive element 274. Level shifter 258 continues to provide 0V on BL1B in response to the state of Qb in volatile cell 102 being a logic high. Likewise if the state of cell 208 is a logic low, level shifter 262 provides 0 v on the second bit line BL2. The first non-volatile word line NVWL1 remains at select voltage (VSEL) and the first source line SL1 is set to VPP voltage to allow low bias voltage at first complementary bit line BLB1 and second true bit line BL2 to program resistive elements 276, 286 to low resistance state.

The voltage level of VPP and VSEL may be at the level of VDD if components of memory cells 268-273 respond to this voltage level. Otherwise, VPP and VSEL voltages may be at a higher level than VDD, and VPP may be lower than VSEL. In the event that VSEL and VDD differ the STORE signal may be split into two signals following the same logical transitions, one at a VDD level driving the enable of latches 253, 257, 261 and 265, the other at VSEL driving the control electrode of transistors 255, 259, 263 and 267.

Similar operations occur for transferring the data from the second and third rows of volatile memory cells 204/210, 206/212 to non-volatile memory cells 269/272, 270/273. For storing in memory cells 269/272 along word line NVWL2, during a first phase, word lines WL1 and WL3 in volatile array 202 are made inactive, word line WL2 is made active, select voltage VSEL is made active, word lines NVWL1 and NVWL3 are made inactive, SL2 is set to zero voltage, and word line NVWL2 is made active. True bit line BL1 and complementary bit line BLB2 are logic high, and complementary bit line BLB1 and true bit line BL2 are logic low. The voltage settings cause resistive elements 278, 292 to go to a high resistance state. During a second phase, source line SL2 is set to VPP voltage while the voltages applied during the first phase remain, thereby setting resistive elements 280, 290 to a low resistance state.

For storing in memory cells 270/273 along word line NVWL3, during a first phase, word lines WL1 and WL2 in volatile array 202 are made inactive, word line WL3 is made active, select voltage VSEL is made active, word lines NVWL1 and NVWL2 are made inactive, SL3 is set to zero voltage, and word line NVWL3 is made active. True bit line BL1 and complementary bit line BLB2 are logic high, and complementary bit line BLB1 and true bit line BL2 are logic low. The voltage settings cause resistive elements 282, 296 to go to a high resistance state. During a second phase, source line SL3 is set to VPP voltage while the voltages applied during the first phase remain, thereby setting resistive elements 284, 294 to a low resistance state.

The process continues until all of the volatile memory that is to be stored has been stored. Power down can then commence. The cycle continues with a restore when power returns.

Figure 5:
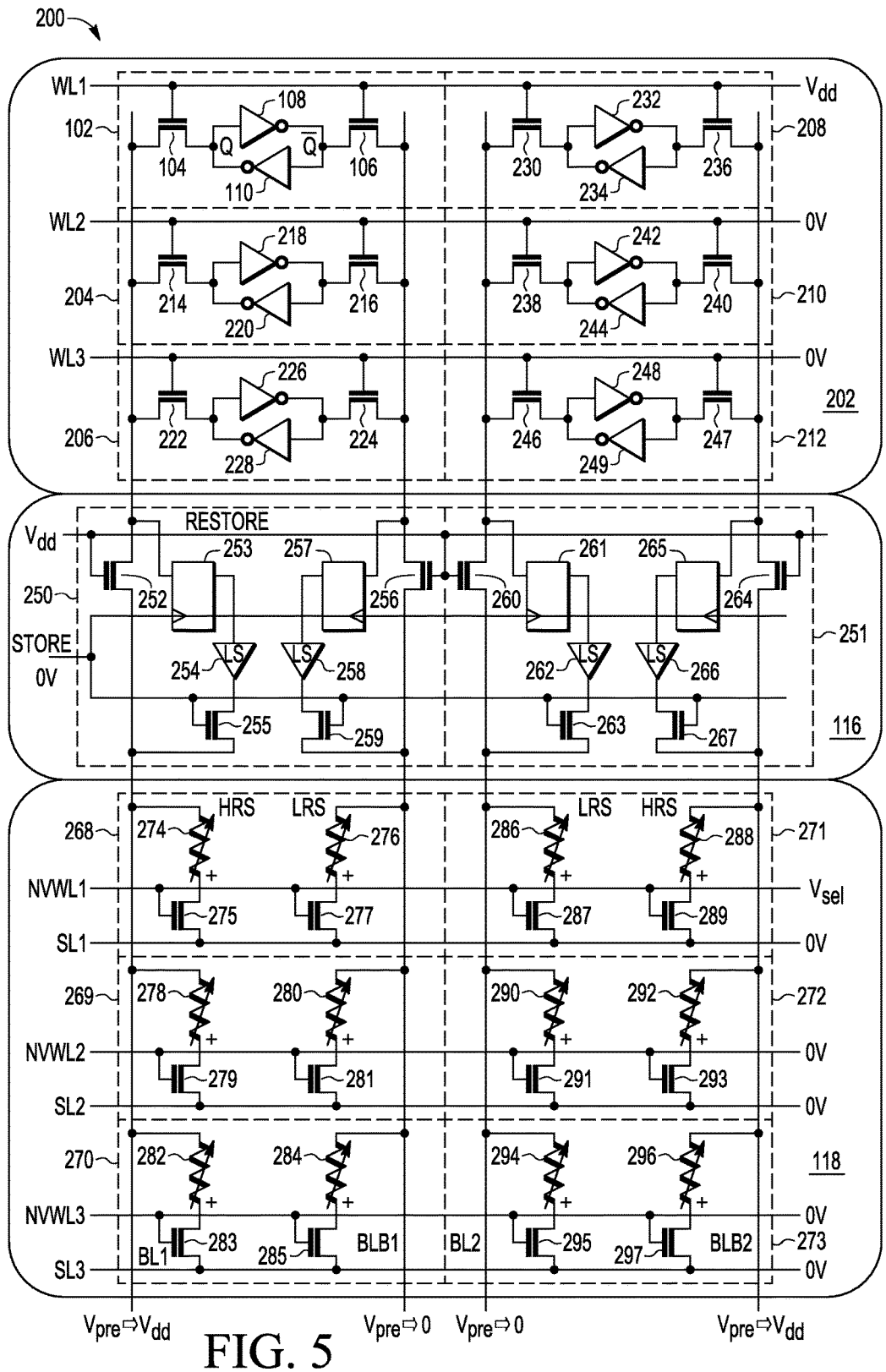
FIG. 5 illustrates a restore operation of the volatile memory in the memory device of FIG. 2.

Referring now to FIG. 5, the state of the bits stored in memory cells 268-273 in NVM array 202 can be written into memory cells 102 and 204-212 in volatile memory array 202 by enabling restore signal RESTORE, word lines WL1-WL3, and non-volatile word lines NVWL1-NVWL3. Note that word lines WL1-WL3 will be enabled one after another in succession during the restore process since store/transfer logic 116 is shared between all rows of memory cells in arrays 202, 118. Only one row of cells can be handled at a time, unless additional store/transfer logic 116 is added between rows or groups of rows of memory cells. Bit lines BL1, BLB1, BL2, and BL2B are precharged to a level VPRE that places the volatile cell into an unstable state such that the cell will react quickly when connected to the programmable resistors.

Enabling restore signal RESTORE causes transistors 252, 256, 260, 264 to be conductive and coupled the portion of bit lines BL1, BL2 and complementary bit lines BLB1, BLB2 in volatile memory array 202 to be coupled to the portion of true bit lines BL1, BL2 and complementary bit lines BLB1, BLB2 in non-volatile memory array 118. Enabling word line WL1 causes pass transistors 104/106 and 230/236 to be conductive. Enabling word line NVWL1 causes the state of memory cells 268, 271 to be coupled to respective true bit lines BL1, BL2 and complementary bit lines BLB1, BLB2. Transistors 104/106 and 230/236, being conductive, couples the states of bit lines BL1, BL1B to inverters 108 and 110 so that the logic state of NVM cell 268 is latched in volatile memory cell 102. Similarly for memory cell 271, transistors 260, 264 couple the state of NVM cell 271 to the true and complement bit lines BL2 and BL2B of volatile memory cell 208. Transistors 230/236 being conductive results in the logic state of NVM cell 271 being latched by inverters 232 and 234.

After successfully restoring data into the memory cells along word line WL1, the word lines WL1 and NVWL1 become inactive so that NVM cells 268, 271 are no longer coupled to bit lines BL1/BL1B and BL2/BL2B, respectively. Enabling word line WL2 causes pass transistors 214/216 and 238/240 to be conductive. Word lines WL2 and NVWL2 are activated. This results in the logic state of NVM cell 269 being coupled to bit lines BL1/BL1B and the logic state of NVM cell 272 being coupled to bit lines BL2/BL2B. With transistors 252, 256, 260, 264 conductive, the logic states of NVM cells 269 and 272 are coupled to bit lines BL1/BL1B and BL2/BL2B of volatile memory array 202. With transistors 214, 216, 238, 240 being conductive due to word line WL2 being active, the inverter pair 218, 220 latch the state on bit line pair BL1/BL1B and inverter pair 242, 244 latch the state of bit line pair BL2/BL2B. Word line WL2 and word line NVWL2 may then be made inactive with the result that memory cells 204, 210 now contain the logic states stored in NVM cells 269, 272, respectively.

After successfully restoring data into the memory cells along word line WL2, the word lines WL2 and NVWL2 become inactive so that NVM cells 270, 273 are no longer coupled to bit lines BL1/BL1B and BL2/BL2B, respectively. Enabling word line WL3 causes pass transistors 222, 224, 246, 247 to be conductive. Word lines WL3 and NVWL3 are activated. This results in the logic state of NVM cell 270 being coupled to bit lines BL1/BL1B and the logic state of NVM cell 273 being coupled to bit lines BL2/BL2B. With transistors 252, 256, 260, 264 conductive, the logic states of NVM cells 270 and 273 are coupled to bit lines BL1/BL1B and BL2/BL2B of volatile memory array 202. With transistors 222, 224, 246, 247 being conductive due to word line WL3 being active, the inverter pair 226, 228 latch the state on bit line pair BL1/BL1B and inverter pair 248, 249 latch the state of bit line pair BL2/BL2B. Word line WL3 and word line NVWL3 may then be made inactive with the result that memory cells 206, 212 now contain the logic states stored in NVM cells 270, 273, respectively.

The process continues with memory cells on other bit lines and word lines not shown until the restoring of data in the volatile memory is complete. Restore signal RESTORE is made inactive and transistors 252, 256, 260, 264 are made non-conductive decoupling the NVM bit lines form the volatile memory bit lines. Normal read/write operations of volatile memory array 202 may then commence.

Figure 6:
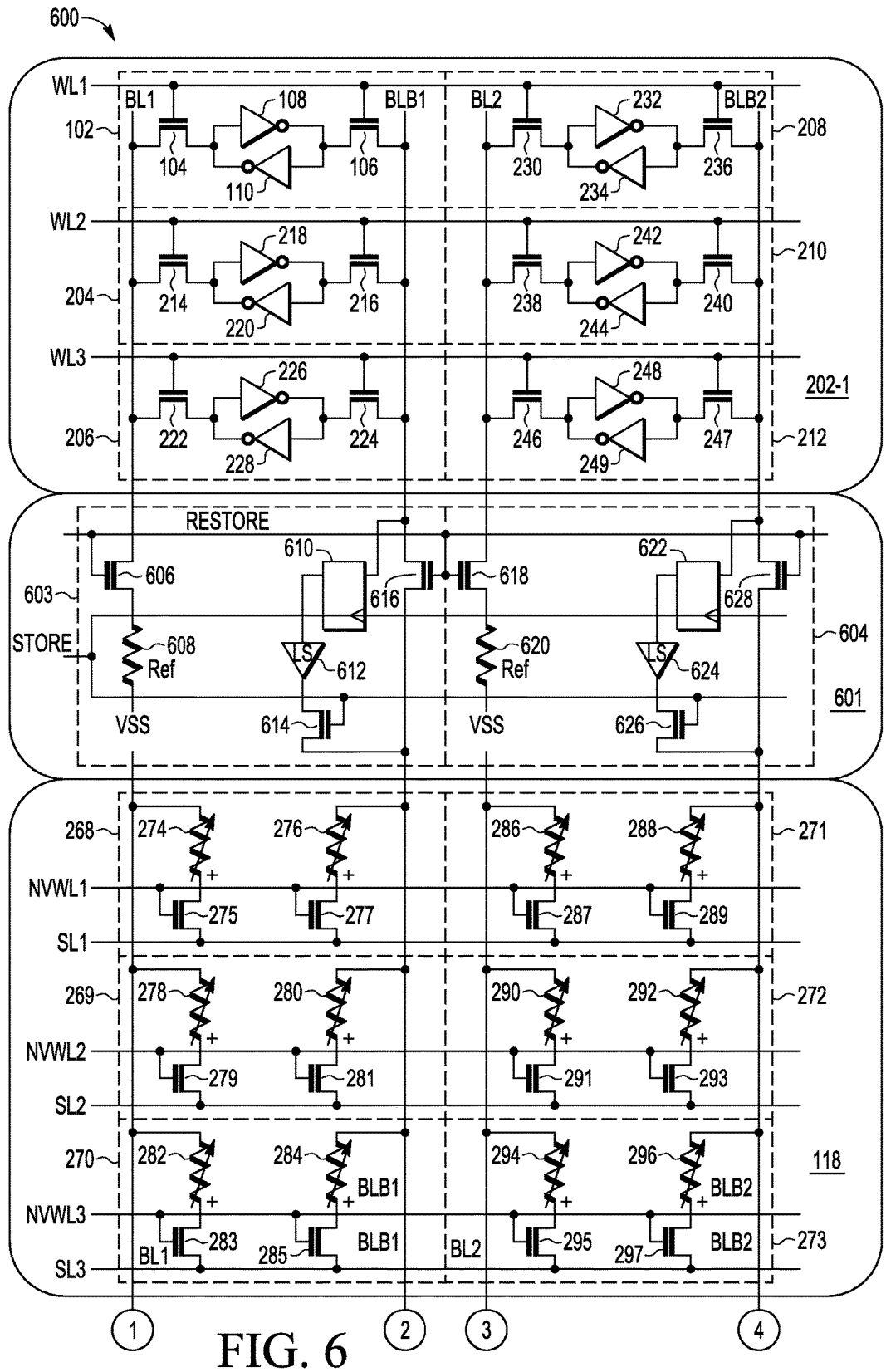
FIGS. 6 and 7 are a circuit diagram of another embodiment of the memory device of FIG. 1.
Figure 7:
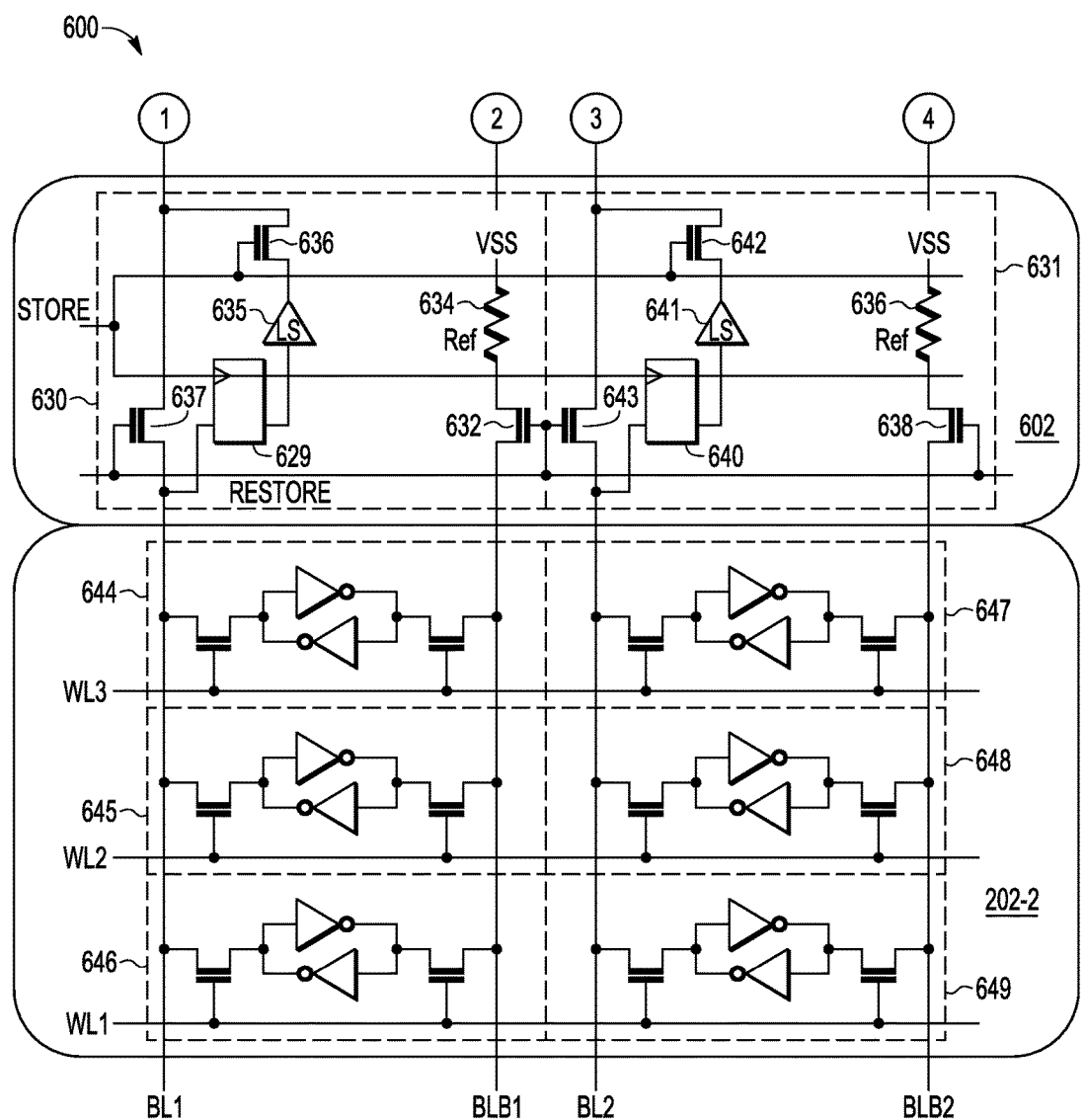

FIG. 6 is a circuit diagram of another embodiment of the memory device 600 in accordance with the present invention that couples two volatile arrays 2021, 2022 (collectively, "202") and store/transfer logics 601, 602 to a single NVM array 118. In the embodiment shown, volatile arrays 202 and NVM array 118 are the same as shown and described for FIG. 2.

A first store/transfer logic 601 is coupled between a first volatile memory array 2021 and NVM array 118 and includes a first store/transfer circuit 603 coupled between first true bit line BL1 and first complementary bit line BLB1, and a second store/transfer circuit 604 coupled between second true bit line BL2 and second complementary bit line BLB2. Store/transfer circuits 603, 604 receive a restore signal RESTORE and a store signal STORE. Restore occurs, as indicated by restore signal RESTORE being active, when volatile memory array 2021 is loaded with data that has been kept in NVM array 118, for example, in response to power being restored. Store occurs, as indicated by signal STORE being active, when NVM array 118 is loaded with the most recent data present in volatile memory array 2021, for example, in preparation for a loss of power.

Store/transfer circuit 603 includes restore transistors 606, 616, reference resistor 608, latch or flip-flop 610, level shifter 612, and store transistor 614. A control electrode of restore transistors 606, 616 is coupled to the restore signal RESTORE. A first current electrode of restore transistor 606 is coupled to first bit line BL1 that is coupled to a first column of memory cells 102, 204, 206 in volatile array 2021 and a second current electrode of restore transistor 606 is coupled to a first terminal of reference resistor 608. A second terminal of reference resistor 608 is terminated at ground or other suitable voltage.

Latch 610 includes a first input coupled to first complementary bit line BLB1 at the first current electrode of restore transistor 614, an active low enable input coupled to the store signal STORE, and an output coupled to an input of level shifter 612. Transistor 614 includes a first current electrode coupled to an output of level shifter 612, a control electrode coupled to the store signal STORE, and a second current electrode coupled to first complementary bit line BLB1 at the second current electrode of restore transistor 616.

Store/transfer circuit 604 includes restore transistors 618, 628, latch or flip-flop 622, level shifter 624, and store transistor 626. A control electrode of restore transistors 618, 628 is coupled to the restore signal RESTORE. A first current electrode of restore transistor 618 is coupled to second bit line BL2 that is coupled to a second column of memory cells 208, 210, 212 in volatile array 2021 and a second current electrode of restore transistor 618 is coupled to a first terminal of reference resistor 620. A second terminal of reference resistor 620 is terminated at ground or other suitable voltage.

Latch 622 includes a first input coupled to second complementary bit line BLB2 at the first current electrode of restore transistor 628, an active low enable input coupled to the store signal STORE, and an output coupled to an input of level shifter 624. Transistor 626 includes a first current electrode coupled to an output of level shifter 624, a control electrode coupled to the store signal STORE, and a second current electrode coupled to second complementary bit line BLB2 and the second current electrode of restore transistor 628.

Regarding NVM array 118, memory cells 268-273 are the same as shown and described in FIG. 2. True bit lines BL1, BL2 and complementary bit lines BL1B and BL2B are coupled to NVM array 118, store/transfer logic 602, and volatile arrays 2022. Resistive elements 274, 278, 282, 286, 290, 294 in memory cells 268-270 are, however, coupled in a single-ended fashion in which respective true bit lines BL1 and BL2 terminate at the second terminal of resistive elements 274, 278, 282, 286, 290, 294. Similarly, resistive elements 276, 280, 284, 288, 292, 296 in memory cells 268-270 are coupled in single-ended fashion in which respective complementary bit lines BL1B and BL2B terminate at the second terminal of resistive elements 276, 280, 284, 288, 292, 296.

Store/transfer circuit 630 includes restore transistors 632, 637, reference resistor 634, latch or flip-flop 629, level shifter 635, and store transistor 636. A control electrode of restore transistors 632, 637 is coupled to the restore signal RESTORE. A first current electrode of restore transistor 632 is coupled to first complementary bit line BL1B that is coupled to a first column of memory cells 644, 645, 646 in second SRAM array 2022 and a second current electrode of restore transistor 632 is coupled to a first terminal of reference resistor 634. A second terminal of reference resistor 634 is terminated at ground or other suitable voltage.

Latch 629 includes a first input coupled to first bit line BL1 at the first current electrode of restore transistor 636, an active low enable input coupled to the store signal STORE, and an output coupled to an input of level shifter 635. Transistor 636 includes a first current electrode coupled to an output of level shifter 635, a control electrode coupled to the store signal STORE, and a second current electrode coupled to first true bit line BL1 and the second current electrode of restore transistor 637.

Store/transfer circuit 631 includes restore transistors 638, 643, latch or flip-flop 640, level shifter 641, and store transistor 642. A control electrode of restore transistors 638, 643 is coupled to the restore signal RESTORE. A first current electrode of restore transistor 638 is coupled to second complementary bit line BL2B that is coupled to a second column of memory cells 647, 648, 649 in SRAM array 2022 and a second current electrode of restore transistor 638 is coupled to a first terminal of reference resistor 639. A second terminal of reference resistor 639 is terminated at ground or other suitable voltage.

Latch 640 includes a first input coupled to second true bit line BL2 and the first current electrode of restore transistor 643, an active low enable input coupled to the store signal STORE, and an output coupled to an input of level shifter 641. Transistor 642 includes a first current electrode coupled to an output of level shifter 641, a control electrode coupled to the store signal STORE, and a second current electrode coupled to second true bit line BL2 and the second current electrode of restore transistor 643.

Resistors 608, 620, 634, 639 can have a fixed value that is approximately mid-way between the high resistance level and the low resistance levels of programmable resistive elements 274, 278, 282, 286, 290, 294, 276, 280, 284, 288, 292, 296. In this embodiment, resistive elements 274, 278, 282, 286, 290, 294 in respective memory cells 268-273 can be used to store the data of a corresponding one of volatile memory cells 644-649. Resistive elements 276, 280, 284, 288, 292, 296 in respective memory cells 268-273 can be used to store the data of a corresponding one of volatile memory cells 102, 204-206. Sharing single-ended NVM cells 268-273 between two SRAM arrays 2021, 2022 allows NVM array 118 to provide double storage capacity with the same space requirements as the embodiment of memory device 200 shown in FIG. 2.

During operation of volatile array 2021, the voltage on BL1 and BL2 will decrease from a pre-charged full voltage to an intermediate voltage that is between the full voltage and zero voltage. Instead of being fully differential during operation as in the memory device 200 of FIG. 2, memory device 600 depends on the voltage sensed at complementary bit lines BLB1 and BLB2 to program data from volatile memory cells 102, 204-212 to resistive elements 276, 280, 284, 288, 292, 296 in NVM cells 268-273, and restore data from resistive elements 276, 280, 284, 288, 292, 296 in NVM cells 268-273 to volatile memory cells 102, 204-212. Similarly, memory device 600 depends on the voltage sensed at true bit lines BL1 and BL2 to program data from volatile memory cells 644-649 to resistive elements 274, 278, 282, 286, 290, 294 in NVM cells 268-273, and restore data from resistive elements 274, 278, 282, 286, 290, 294 in NVM cells 268-273 to volatile memory cells 644-649.

Note that in another embodiment, resistors 608, 620, 634, 639 may be removed, thus allowing transistors 606, 618, 634, 639 to completely pull down the voltage on respective bit lines BL1, BL2, BL1B, and BL2B during operation of the respective volatile memories 2021, 2022.

Thus it is seen that the use of a transfer circuit between the bit lines of the volatile memory and the NVM can be effective in providing a better solution for programming of the NVM cells.

By now it should be appreciated that in some embodiments, there has been provided a memory device having a first volatile memory cell (102 in FIG. 2 or 644 in FIG. 6) having a first volatile access transistor (104) with a current electrode coupled with a first volatile bit line (BL1), a first non-volatile memory cell (268) having a first non-volatile access transistor (275) with a current electrode coupled with a first non-volatile bit line (BL1), and a transfer circuit (250 in FIG. 2 or 630 in FIG. 6) coupled between the first volatile bit line and the first non-volatile bit line. The transfer circuit is configured to couple (255) data latched (253) from the first volatile bit line with the first non-volatile bit line during a store operation, and couple (252) the first volatile bit line with the first non-volatile bit line during a restore operation.

In another aspect, the transfer circuit can be configured to couple the first volatile bit line with the first non-volatile bit line during the restore operation via a connective device (252) having a control electrode coupled to a restore signal.

In another aspect, the transfer circuit can be configured to couple data latched from the first volatile bit line with the first non-volatile bit line during the store operation via a connective device (255) having a control electrode coupled to a store signal.

In another aspect, the transfer circuit can comprise a latch device (253) coupled between the first volatile bit line and the connective device (255), the latch device configured to latch data from the first volatile bit line.

In another aspect, the transfer circuit further comprises a level shifter (254) coupled between the latch device (253) and the connective device (255), the level shifter configured to output a shifted voltage in response to an input voltage of the level shifter.

In another aspect, the first volatile memory cell (102) can further comprise a second volatile access transistor (106) with a current electrode coupled with a second volatile bit line (BLB1), and the second volatile bit line (BLB1) is complementary to the first volatile bit line (BL1).

In another aspect, the first non-volatile memory cell (268) can further comprise a second non-volatile access transistor (277) with a current electrode coupled with a second non-volatile bit line (BLB1).

In another aspect, the first non-volatile memory cell (268) can further comprise a first resistive element (274) coupled between the first non-volatile access transistor (275) and the first non-volatile bit line (BL1), a second resistive element (276) coupled between the second non-volatile access transistor (277) and the second non-volatile bit line (BLB1), and the first resistive element is configured to store a first resistive state and the second resistive element is configured to store a second resistive state that is complementary to the first resistive state.

In another aspect, the transfer circuit can be further coupled between the second volatile bit line (BLB1) and the second non-volatile bit line (BLB1). The transfer circuit can be further configured to couple (259) data latched (257) from the second volatile bit line with the second non-volatile bit line during the store operation, and couple (256) the second volatile bit line with the second non-volatile bit line during the restore operation.

In another aspect, (FIG. 6, single ended RRAM) the first non-volatile memory cell (268) can further comprise a resistive element (274) coupled between the first non-volatile access transistor (275) and the first non-volatile bit line (BL1), the resistive element configured to store a resistive state (HRS/LRS).

In another aspect, (FIG. 6, 2 SRAM and single ended RRAM) the memory device can further comprise a second volatile memory cell (102 in top SRAM 2021 or 644 in bottom SRAM 2022) having a second volatile access transistor with a current electrode coupled with a second volatile bit line (BLB1 in top SRAM or BL2 in bottom SRAM), and a second non-volatile memory cell (on same row as 268) having a second non-volatile access transistor (277 coupled to BLB1 or 287 coupled to BL2) with a second current electrode coupled with a second non-volatile bit line (BLB1 to top SRAM or BL2 to bottom SRAM). A control electrode of the first non-volatile access transistor and a control electrode of the second non-volatile access transistor can be coupled to a same non-volatile word line (NVWL1). A second transfer circuit (603 in top transfer circuit or 631 in bottom transfer circuit) can be coupled between the second volatile bit line and the second non-volatile bit line.

In another aspect, the first volatile memory cell and the second volatile memory cell are located in a same volatile memory cell array (644 and 647 in bottom 2022 array).

In another aspect, the first volatile memory cell and the second volatile memory cell can be located in different volatile memory cell arrays (644 in bottom 2022 and 102 in top 2021).

In other embodiments, a memory device can comprise a first volatile memory array (202) having a plurality of rows of volatile memory cells, a first non-volatile memory array (118) having a plurality of rows of non-volatile memory cells, and a first transfer system (116) coupled between the first volatile memory array and the first non-volatile memory array. The first transfer system includes a plurality of rows of transfer circuits. Each volatile memory cell (102) in a first row of volatile memory cells of the first volatile memory array is coupled with a respective transfer circuit (250) in a first row of transfer circuits of the first transfer system. Each transfer circuit (250) in the first row of transfer circuits is coupled with a respective non-volatile memory cell (268) in a first row of non-volatile memory cells of the first non-volatile memory array. The first row of transfer circuits is configured to couple (255) data latched (253) from the first row of volatile memory cells with the first row of non-volatile memory cells in response to a combination of a selection of a first volatile word line coupled to the first row of volatile memory cells, a selection of a first non-volatile word line coupled to the first row of non-volatile memory cells, and a selection of a first store signal line coupled to the first row of transfer circuits. The first row of transfer circuits is further configured to couple (252) the first row of volatile memory cells with the first row of non-volatile memory cells in response to a combination of the selection of the first volatile word line, the selection of the first non-volatile word line, and a selection of a first restore signal line coupled to the first row of transfer circuits.

In another aspect, the memory device further comprises a second volatile memory array (top 2021) having another plurality of rows of volatile memory cells, and a second transfer system (601) coupled between the second volatile memory array and the first non-volatile memory array. The second transfer system can have another plurality of rows of transfer circuits. Each volatile memory cell (102) in a second row of volatile memory cells of the second volatile memory array is coupled with a respective transfer circuit (603) in a second row of transfer circuits of the second transfer system. The first row of non-volatile memory cells in the first non-volatile memory array includes a first set (cells containing 274, 286) of non-volatile memory cells and a second set (cells containing 276, 288) of non-volatile memory cells. Each transfer circuit (630) in the first row of transfer circuits of the first transfer system is coupled with a respective non-volatile memory cell in the first set (274, 286) of non-volatile memory cells. Each transfer circuit (603) in the second row of transfer circuits of the second transfer system is coupled with a respective non-volatile memory cell in the second set (276, 288) of non-volatile memory cells.

In another aspect, the second row of transfer circuits (row of 603) can be configured to couple (614) data latched (610) from the second row of volatile memory cells with the second set (276, 288) of non-volatile memory cells in response to a combination of a selection of a second volatile word line coupled to the second row of volatile memory cells (WL1 in top 2021), a selection of the first non-volatile word line coupled to the first row of non-volatile memory cells (NVWL1), and a selection of a second store signal line coupled to the second row of transfer circuits. The second row of transfer circuits (row of 603) can be further configured to couple (616) the second row of volatile memory cells with the second set (274, 286) of non-volatile memory cells in response to a combination of the selection of the second volatile word line (WL1 in top 2021), the selection of the first non-volatile word line (NVWL1), and a selection of a second restore signal line coupled to the second row of transfer circuits.

In another aspect, each volatile memory cell (644) of the first row of volatile memory cells is coupled with a respective volatile bit line (BL1) and a respective complementary volatile bit line (BLB1), each transfer circuit (630) of the first row of transfer circuits is configured to couple the respective volatile bit line with a respective non-volatile bit line via a first connective device (637) having a control electrode coupled to the first restore signal line, each transfer circuit of the first row of transfer circuits is further configured to couple the respective complementary volatile bit line with a reference resistive element (634) via a second connective device (632) having a control electrode coupled to the first restore signal line, each non-volatile memory cell (268) of the first row of non-volatile memory cells includes a resistive element (274) configured to store one of a low resistive state value and a high resistive state value, and the reference resistive element is configured to store a resistive state value between the low resistive state value and the high resistive state value.

In still other embodiments, a method can comprise, during a store operation performed by a transfer circuit coupled between a volatile memory cell and a non-volatile memory cell, enabling a latch (253) to store first data of the volatile memory cell (102), coupling (255) the latch with the non-volatile memory cell (268), and programming the non-volatile memory cell to store the first data. During a restore operation performed by the transfer circuit, the method can further comprise coupling (252) the non-volatile memory cell with the volatile memory cell. The non-volatile memory cell stores second data, and the coupling the non-volatile memory cell with the volatile memory cell results in the volatile memory cell storing the second data.

In another aspect, a level shifter (254) can be coupled between the latch (253) and the non-volatile memory cell (268), the level shifter can be configured to output a voltage in proportion to the first data stored in the latch, and programming the non-volatile memory cell to store the first data can comprise utilizing the voltage to program a resistive element (274) of the first non-volatile memory cell to store a resistive state corresponding to the first data.

In another aspect, the volatile memory cell (102) can comprise an inverter pair (108, 110) coupled with an access transistor (104) at a first node (Q), and coupling the non-volatile memory cell with the volatile memory cell results in the second data stored by the non-volatile memory cell being provided to the inverter pair via the access transistor.

Although the invention is described herein with reference to specific embodiments, various modifications and changes can be made without departing from the scope of the present invention as set forth in the claims below. For example, an inverter may consist of any circuit providing the function of logic inversion. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory device comprising:
   a first volatile memory cell having
      a first volatile access transistor with a current electrode coupled with a first volatile bit line;
   a first non-volatile memory cell having
      a first non-volatile access transistor with a current electrode coupled with a first non-volatile bit line; and
   a transfer circuit coupled between the first volatile bit line and the first non-volatile bit line, wherein
      the transfer circuit comprises a latch device coupled between the first volatile bit line and a connective device, the latch device is configured to latch data from the first volatile bit line, and the transfer circuit is configured to:
         couple data latched from the first volatile bit line with the first non-volatile bit line during a store operation, and
         couple the first volatile bit line with the first non-volatile bit line during a restore operation,
         couple data latched from the first volatile bit line with the first non-volatile bit line during the store operation via the connective device having a control electrode coupled to a store signal.

2. The memory device of claim 1, wherein the transfer circuit is configured to couple the first volatile bit line with the first non-volatile bit line during the restore operation via a connective device having a control electrode coupled to a restore signal.

3. The memory device of claim 1, wherein the transfer circuit further comprises a level shifter coupled between the latch device and the connective device, the level shifter configured to output a shifted voltage in response to an input voltage of the level shifter.

4. The memory device of claim 1, wherein the first volatile memory cell further comprises a second volatile access transistor with a current electrode coupled with a second volatile bit line, and the second volatile bit line is complementary to the first volatile bit line.

5. The memory device of claim 4, wherein the first non-volatile memory cell further comprises a second non-volatile access transistor with a current electrode coupled with a second non-volatile bit line.

6. The memory device of claim 5, wherein
the first non-volatile memory cell further comprises
a first resistive element coupled between the first non-volatile access transistor and the first non-volatile bit line, and
a second resistive element coupled between the second non-volatile access transistor and the second non-volatile bit line, and
the first resistive element is configured to store a first resistive state and the second resistive element is configured to store a second resistive state that is complementary to the first resistive state.

7. The memory device of claim 5, wherein
the transfer circuit is further coupled between the second volatile bit line and the second non-volatile bit line, and
the transfer circuit is further configured to
couple data latched from the second volatile bit line with the second non-volatile bit line during the store operation, and
couple the second volatile bit line with the second non-volatile bit line during the restore operation.

8. The memory device of claim 1, wherein the first non-volatile memory cell further comprises a resistive element coupled between the first non-volatile access transistor and the first non-volatile bit line, the resistive element configured to store a resistive state.

9. The memory device of claim 1, wherein
the memory device further comprises:
a second volatile memory cell having
a second volatile access transistor with a current electrode coupled with a second volatile bit line;
a second non-volatile memory cell having
a second non-volatile access transistor with a second current electrode coupled with a second non-volatile bit line, wherein
a control electrode of the first non-volatile access transistor and a control electrode of the second non-volatile access transistor are coupled to a same non-volatile word line; and
a second transfer circuit is coupled between the second volatile bit line and the second non-volatile bit line.

10. The memory device of claim 9, wherein
the first volatile memory cell and the second volatile memory cell are located in a same volatile memory cell array.

11. The memory device of claim 9, wherein
the first volatile memory cell and the second volatile memory cell are located in different volatile memory cell arrays.

12. A memory device comprising:
a first volatile memory array having a plurality of volatile memory cells arranged in a plurality of rows of volatile memory cells;
a first non-volatile memory array having a plurality of non-volatile memory cells arranged in a plurality of rows of non-volatile memory cells; and
a first transfer system coupled between the first volatile memory array and the first non-volatile memory array,
the first transfer system having a first row of transfer circuits that each include a latch device coupled between a respective volatile bit line and a respective non-volatile bit line, wherein
each volatile memory cell in a first row of volatile memory cells of the first volatile memory array is coupled with a respective transfer circuit in the first row of transfer circuits of the first transfer system,
each transfer circuit in the first row of transfer circuits is coupled with a respective non-volatile memory cell in a first row of non-volatile memory cells of the first non-volatile memory array,
the first row of transfer circuits is configured to couple data latched from the first row of volatile memory cells with the first row of non-volatile memory cells in response to a combination of a selection of a first volatile word line coupled to the first row of volatile memory cells, a selection of a first non-volatile word line coupled to the first row of non-volatile memory cells, and a selection of a first store signal line coupled to the first row of transfer circuits, and
the first row of transfer circuits is further configured to couple the first row of volatile memory cells with the first row of non-volatile memory cells in response to a combination of the selection of the first volatile word line, the selection of the first non-volatile word line, and a selection of a first restore signal line coupled to the first row of transfer circuits.

13. The memory device of claim 12, further comprising:
a second volatile memory array having another plurality of rows of volatile memory cells; and
a second transfer system coupled between the second volatile memory array and the first non-volatile memory array, the second transfer system having a second row of transfer circuits that each include a first latch device coupled between a respective volatile bit line and a respective non-volatile bit line and a second latch device coupled between a respective complementary volatile bit line and a respective complementary non-volatile bit line, wherein
each volatile memory cell in a second row of volatile memory cells of the second volatile memory array is coupled with a respective transfer circuit in the second row of transfer circuits of the second transfer system,
the first row of non-volatile memory cells in the first non-volatile memory array includes a first set of non-volatile memory cells and a second set of non-volatile memory cells,
each transfer circuit in the first row of transfer circuits of the first transfer system is coupled with a respective non-volatile memory cell in the first set of non-volatile memory cells, and
each transfer circuit in the second row of transfer circuits of the second transfer system is coupled with a respective non-volatile memory cell in the second set of non-volatile memory cells.

14. The memory device of claim 13, wherein:
the second row of transfer circuits is configured to couple data latched from the second row of volatile memory cells with the second set of non-volatile memory cells in response to a combination of a selection of a second volatile word line coupled to the second row of volatile memory cells, a selection of the first non-volatile word line coupled to the first row of non-volatile memory cells, and a selection of a second store signal line coupled to the second row of transfer circuits, and the second row of transfer circuits is further configured to couple the second row of volatile memory cells with the second set of non-volatile memory cells in response to a combination of the selection of the second volatile word line, the selection of the first non-volatile word line, and a selection of a second restore signal line coupled to the second row of transfer circuits.

15. The memory device of claim 13, wherein:
each volatile memory cell of the first row of volatile memory cells is coupled with the respective volatile bit line and the respective complementary volatile bit line,
each transfer circuit of the first row of transfer circuits is configured to couple the respective volatile bit line with the respective non-volatile bit line via a first connective device having a control electrode coupled to the first restore signal line,
each transfer circuit of the first row of transfer circuits is further configured to couple the respective complementary volatile bit line with a reference resistive element via a second connective device having a control electrode coupled to the first restore signal line,
each non-volatile memory cell of the first row of non-volatile memory cells includes a resistive element configured to store one of a low resistive state value and a high resistive state value, and
the reference resistive element is configured to store a resistive state value between the low resistive state value and the high resistive state value.

16. The memory device of claim 12, wherein:
the plurality of volatile memory cells are further arranged in a plurality of columns of volatile memory cells,
the plurality of non-volatile memory cells are further arranged in a plurality of columns of non-volatile memory cells,
each volatile memory cell in a first column of the plurality of columns of volatile memory cells is coupled with a first transfer circuit in the first row of transfer circuits, and
each non-volatile memory cell in a first column of the plurality of columns of non-volatile memory cells is coupled with the first transfer circuit.

17. A method comprising:
during a store operation performed by a transfer circuit coupled between a volatile memory cell and a non-volatile memory cell:
enabling a latch to store first data of the volatile memory cell,
coupling the latch with the non-volatile memory cell, and
programming the non-volatile memory cell to store the first data; and
during a restore operation performed by the transfer circuit:
coupling the non-volatile memory cell with the volatile memory cell, wherein
the non-volatile memory cell stores second data, and
the coupling the non-volatile memory cell with the volatile memory cell results in the volatile memory cell storing the second data;
wherein
a level shifter is coupled between the latch and the non-volatile memory cell,
the level shifter is configured to output a voltage in proportion to the first data stored in the latch, and
the programming the non-volatile memory cell to store the first data comprises:
utilizing the voltage to program a resistive element of the first non-volatile memory cell to store a resistive state corresponding to the first data.

* * * * *